United States Patent
Brooks et al.

(10) Patent No.: US 12,231,085 B2
(45) Date of Patent: Feb. 18, 2025

(54) WATER PRODUCING SYSTEM FOR A LIQUID TRANSFER MAT

(71) Applicant: Enertopia Corp., Kelowna (CA)

(72) Inventors: Barry Richard Brooks, Pilot Hill, CA (US); Mark E. Snyder, Poway, CA (US)

(73) Assignee: Enertopia Corp., Kelowna (CA)

( * ) Notice: Subject to any disclaimer, the term of this patent is extended or adjusted under 35 U.S.C. 154(b) by 0 days.

(21) Appl. No.: 17/888,320

(22) Filed: Aug. 15, 2022

(65) Prior Publication Data

US 2023/0050673 A1 Feb. 16, 2023

Related U.S. Application Data

(60) Provisional application No. 63/233,642, filed on Aug. 16, 2021.

(51) Int. Cl.
*H02S 40/42* (2014.01)
*B01D 53/26* (2006.01)
*C22B 26/12* (2006.01)
*H05K 7/20* (2006.01)

(52) U.S. Cl.
CPC .......... *H02S 40/425* (2014.12); *B01D 53/265* (2013.01); *C22B 26/12* (2013.01); *H05K 7/20318* (2013.01); *H05K 7/20327* (2013.01)

(58) Field of Classification Search
CPC ........ H02S 40/42; H02S 40/425; H02S 40/44; H01L 31/0521; H05K 7/20318; H05K 7/20327; B01D 53/265
See application file for complete search history.

(56) References Cited

U.S. PATENT DOCUMENTS

| 6,945,063 B2 | 9/2005 | Max |
| 2002/0189662 A1 | 12/2002 | Lomparski |
| 2015/0349178 A1* | 12/2015 | Rubio .................. H02S 40/425 |
| | | 136/248 |
| 2017/0263789 A1* | 9/2017 | Simpson ................. H02S 40/42 |

FOREIGN PATENT DOCUMENTS

| WO | WO-2020099950 A1 * | 5/2020 | ............. H02S 40/42 |
| WO | 2020157290 A1 | 8/2020 | |
| WO | 2021154919 A1 | 8/2021 | |

\* cited by examiner

*Primary Examiner* — Andrew J Golden
(74) *Attorney, Agent, or Firm* — Mintz Levin Cohn Ferris Glovsky and Popeo, P.C.

(57) ABSTRACT

A water producing system for a photovoltaic panel may include a moisture collection layer, a liquid transfer mat, and a moisture collection substrate. The moisture collection layer may collect moisture from condensation and direct moisture away from the photovoltaic panel. The liquid transfer mat may include a plurality of tubes through which a chilled heat transfer liquid passes. The moisture collection substrate may include a thermally conductive material. The chilled heat transfer liquid within the liquid transfer mat may absorb heat from the photovoltaic panel and from ambient air through the moisture collection substrate, thereby reducing a temperature of the photovoltaic panel and condensing water on the moisture collection substrate to produce water.

20 Claims, 7 Drawing Sheets

WATER PRODUCING SYSTEM FOR A LIQUID TRANSFER MAT

CROSS-REFERENCE TO RELATED APPLICATIONS

The present application claims priority to U.S. Provisional Application No. 63/233,642, filed Aug. 16, 2021, and entitled "Water Producing System for a Liquid Transfer Mat," the entirety of which is incorporated herein by reference.

TECHNICAL FIELD

The current subject matter described herein relates generally to techniques for water production and more particularly to a water producing system for a liquid transfer mat.

BACKGROUND

Generally, photovoltaic panels, such as solar panels, absorb solar energy and convert the solar energy into electrical energy. However, photovoltaic panels can become very hot. Operating at such high temperatures can cause the photovoltaic panels to rapidly degrade, and to inefficiently convert the solar energy into electrical energy. In some instances a carrier may be used that includes a fluid to absorb heat from the photovoltaic panels. However, such carriers may inefficiently reduce the heat of the photovoltaic panels, may slowly reduce the heat of the photovoltaic panels, may be prone to collapsing, may leak, may be difficult to install, and/or may otherwise fail. Additionally, in some instances, the photovoltaic panels may be used in locations that are dry or in regions where it may be difficult to obtain water.

SUMMARY

The details of one or more variations of the subject matter described herein are set forth in the accompanying drawings and the description below. Other features and advantages of the subject matter described herein will be apparent from the description and drawings, and from the claims. The claims that follow this disclosure are intended to define the scope of the protected subject matter.

According to some aspects, a water producing system for a photovoltaic panel may include a moisture collection layer, a liquid transfer mat, and a moisture collection substrate. The moisture collection layer may collect moisture from condensation and direct moisture away from the photovoltaic panel. The liquid transfer mat may include a plurality of tubes through which a chilled heat transfer liquid passes. The moisture collection substrate may include a thermally conductive material. The chilled heat transfer liquid within the liquid transfer mat may absorb heat from the photovoltaic panel and from ambient air through the moisture collection substrate, thereby reducing a temperature of the photovoltaic panel and condensing water on the moisture collection substrate to produce water.

In some aspects, the system includes a fluid chiller configured to supply the chilled heat transfer fluid to the liquid transfer mat.

In some aspects, the system includes the photovoltaic panel. In some aspects, the photovoltaic panel includes a first side configured to absorb solar energy, and a second side opposite the first side. The moisture collection layer may contact the second side of the photovoltaic panel. In some aspects, the moisture collection substrate further includes a coating. The coating may include one or more of a surfactant and a hydrophobic material. The coating may encourage the collection of water condensed on the moisture collection substrate.

In some aspects, the moisture collection layer includes one or more of an open cell dense foam and a porous reticulated foam.

In some aspects, the moisture collection layer includes a porous reticulated foam.

In some aspects, moisture absorbed by the moisture collection layer and/or water condensed on the moisture collection substrate is collected in a water collection container.

In some aspects, the liquid transfer mat includes a flexible material.

In some aspects, the water collection substrate supports the liquid transfer mat. In some aspects, the fluid chiller and the liquid transfer mat define a closed loop system.

According to some aspects, a water producing system includes a liquid transfer mat and a moisture collection substrate. The liquid transfer mat may include a plurality of tubes through which a chilled heat transfer fluid passes. The moisture collection substrate may be coupled to the liquid transfer mat. The moisture collection substrate may have a thermally conductive material. The moisture collection substrate may improve heat transfer from ambient air to the chilled heat transfer fluid. A temperature differential between the chilled heat transfer fluid and the ambient air may cause condensation of water to form on the moisture collection substrate.

According to some aspects, a water producing system includes an enclosure and a liquid transfer mat. The liquid transfer mat includes a plurality of tubes through which a chilled heat transfer fluid passes. The liquid transfer mat may be positioned within the enclosure. The system may include a solar shield coupled to the enclosure. The solar shield may heat air within the enclosure to increase a temperature differential between the chilled heat transfer fluid and the air. The increased temperature differential may draw moisture from the air.

In some aspects, the system also includes a screen that may support the solar shield. The screen may prevent dust from entering the enclosure.

According to some aspects, a method of producing water includes providing a moisture collection layer to a photovoltaic panel, providing a liquid transfer mat to the moisture collection layer, and providing a moisture collection substrate to the liquid transfer mat. The moisture collection substrate may include a material having a high thermal conductivity. The liquid transfer mat may include a plurality of tubes through which a chilled heat transfer fluid passes to absorb heat from the photovoltaic panel. The chilled heat transfer liquid within the liquid transfer mat may absorb heat from the photovoltaic panel and from ambient air through the moisture collection substrate, thereby reducing a temperature of the photovoltaic panel and condensing water on one or more of the moisture collection substrate and the liquid transfer mat to produce water. The moisture collection layer may absorb moisture from the liquid transfer mat and/or air in contact with the moisture collection layer.

According to some aspects, a method of providing a fluid to a lithium processing and/or extraction system includes providing a photovoltaic panel, and providing a water producing system to the photovoltaic panel. The water producing system may include a moisture collection layer, a liquid transfer mat and a moisture collection substrate.

According to some aspects, a method of producing water may include receiving, by a water producing system and from a fluid chiller, a chilled heat transfer fluid, transferring, from one or more of a photovoltaic panel and ambient air, heat to the heat transfer fluid to heat the heat transfer fluid and condense water on a moisture collection substrate of the water producing system to produce water, and provide, to one or more of a heat processing system and the fluid chiller, the heated heat transfer fluid.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements.

DETAILED DESCRIPTION

Figure 1:
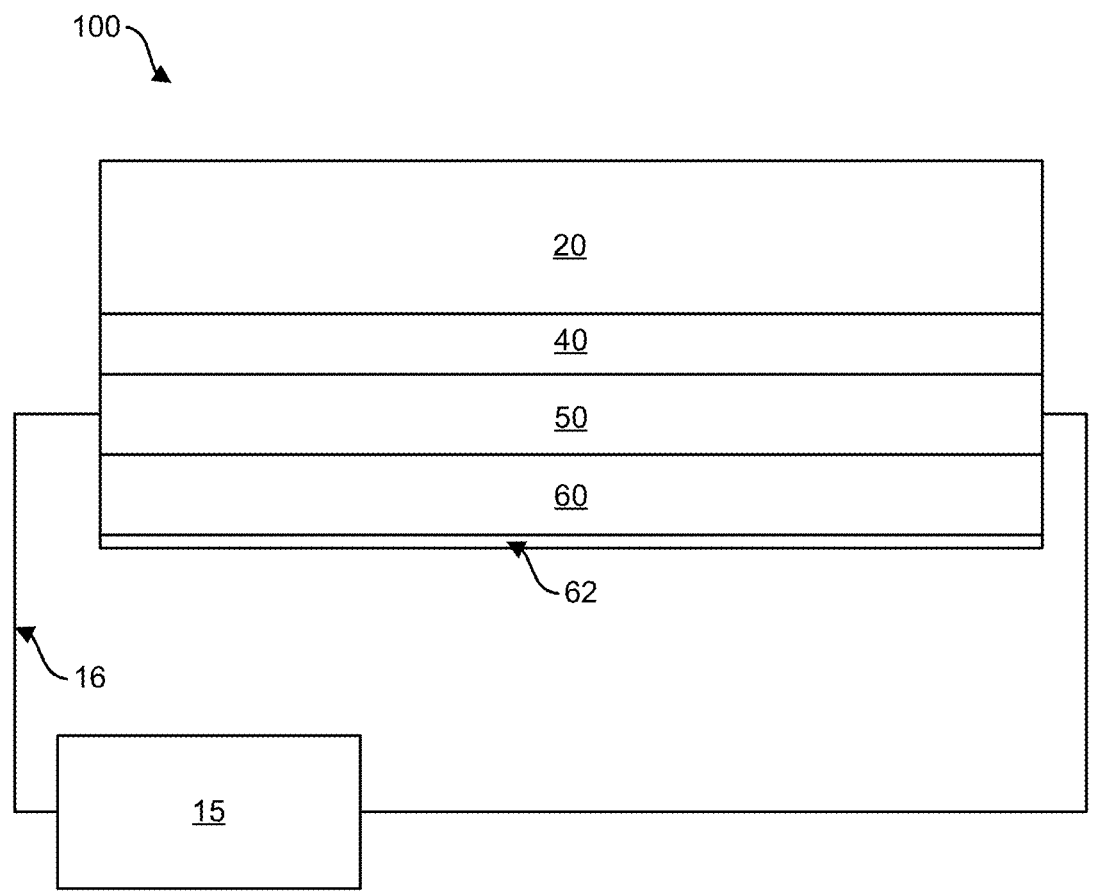
FIG. 1 illustrates schematically illustrates a water producing system consistent with implementations of the current subject matter.

Generally, photovoltaic panels, such as solar panels, absorb solar energy and convert the solar energy into electrical energy. However, photovoltaic panels can become very hot, especially in climates that are very dry and warm, such as desert climates. Operating at high temperatures can cause the photovoltaic panels to rapidly degrade, and to convert the solar energy into electrical energy less efficiently. Thus, operating photovoltaic panels at high temperatures may cause the panels to be replaced or repaired more often.

For example, photovoltaic panels convert solar energy into useful electrical current. The photovoltaic panels may be rated convert the solar energy into electrical energy at a rate of 15-20% effectiveness. The remaining solar energy (e.g., the solar energy that is not converted into electrical energy) is converted into heat, which may reduce performance of the photovoltaic panel, degrade the photovoltaic panel, and/or reduce a lifespan of the photovoltaic panel. In some instances, the optimal temperature for a face of a photovoltaic panel is 77 degrees fahrenheit. Every degree (e.g., 1° F., 1.8° F., and/or the like) above 77 degrees fahrenheit reduces the current output of the panel by approximately 0.5% to 1%. In some instances, 50% of the unused conversion energy transfers to the back of the photovoltaic panel and 50% of the unused conversion energy dissipates off the face of the photovoltaic panel. The temperature of the back face of the photovoltaic panel may thus reach at least 50 degrees higher than the optimal temperature (e.g., 140 degrees fahrenheit or higher).

Such circumstances may be is especially true in hot dry climates, where the difference in temperature can be 75 degrees between night and day temperatures. With it being common for photovoltaic panels to reach temperatures of 137° F., a solar array being 60° F. greater into the heat stress zone would equal a decrease of 15% or more on the output. Nevertheless, regardless of the geographic location of the photovoltaic panel and the time of year, waste heat is produced when solar energy is converted into electrical energy. With over 1.2 TW (Terawatts) of worldwide photovoltaic panel installed capacity, and another 100 Gigawatts of photovoltaic panel capacity coming online per year, the inefficiencies that are currently experienced due to overheating are quite extensive, and expensive. Accordingly, the waste heat reduces performance of the photovoltaic panel, degrades the photovoltaic panel, reduces an output of the photovoltaic panel, and/or reduces a lifespan of the photovoltaic panel.

The water producing system (e.g., a waste water producing system) consistent with implementations of the current subject matter may reduce the operating temperature of the photovoltaic panels, by for example, quickly and efficiently recovering, transferring, extracting, and/or collecting heat from the photovoltaic panels. Thus, the water producing system described herein may extend the lifespan of the photovoltaic panels, reduce degradation of the photovoltaic panels, increase an output of the photovoltaic panels, remove or reduce heat stress associated with running photovoltaic panels in hot, arid regions, and/or the like.

In some instances, systems for reducing a temperature of a photovoltaic panel are used in residential settings. For example, the systems may be applied using a swimming pool as a heat sink to reduce the temperature of the photovoltaic panel. However, such systems may inefficiently reduce the temperature of the photovoltaic panel, and may not be used in certain climates, such as desert climates, where a large amount of water to cool the panel is scarce. The water producing system consistent with implementations of the current subject matter may be used in such climates, such as desert climates, without using a large amount of a liquid, such as water. The water producing system may also be used in such climates to produce water, which can feed the water producing system and/or be fed to other systems, such as heat processing systems, air conditioning systems, pool heating systems, area heating systems, agricultural processes, lithium processing systems, and/or the like, that require water.

The water producing system may additionally and/or alternatively be used with large commercial arrays of photovoltaic panels, in residential systems and/or the like. The water producing system described herein may additionally and/or alternatively more efficiently extract and/or transfer heat from the photovoltaic panel to rapidly cool the photovoltaic panel. The efficient extraction of heat from the photovoltaic panel may also cause more efficient heating of a liquid in a liquid transfer system that may be used for other systems, such as heat processing systems, air conditioning systems, pool heating systems, area heating systems, agricultural processes, lithium processing systems, and/or the like.

Generally, moisture that exists in air is measured as grains of moisture per pound of dry air. At the point of saturation (e.g., when air cannot retain moisture, known as dew point), water forms on cool surfaces. This process may generally occur at night, but can also occur during the day in certain climates, such as humid climates. For example, during the heat of the day, as ambient hot air pulls moisture from surrounding environments, moisture will also form on cool surfaces. The water producing system consistent with implementations of the current subject matter may additionally and/or alternatively take advantage of these atmospheric conditions. For example, a chilled fluid may be passed through the water producing system described herein to improve the transfer of heat from the back of the photovoltaic panel into the water producing system. The chilled fluid may also create a large difference in temperature between the chilled fluid and the air temperature. The large difference in temperature may help to increase the amount of water produced on the surfaces of the water producing system. The water producing system described herein may thus generate, collect and/or retain the moisture formed at dew point temperatures.

The water producing system described herein may be coupled to a chiller or other supply of chilled fluid. For example, the water producing system may include a liquid transfer system or mat, through which the chilled fluid passes. The chilled fluid may increase a temperature difference between the chilled fluid or other components of the water producing system as a result of the chilled fluid, and the ambient air in contact with the water producing system. The increased temperature difference may help to increase the amount of condensation forming on the water producing system. The water producing system may further take advantage of the humidity of the air or other atmospheric conditions. For example, in humid conditions, the water producing system may generate condensation on the water producing system at a greater rate, thereby producing a greater amount of water.

Additionally and/or alternatively, the water producing system consistent with implementations of the current subject matter includes a moisture collection layer (e.g., a layer including a foam, a metal, a metallic honeycomb, a metallic mesh, an aluminum mesh, mineral wool, and/or the like) and/or a water collection substrate that may collect and/or retain the generated moisture or condensation formed at dew point temperatures. For example, the moisture collection layer may be positioned between a photovoltaic panel and the liquid transfer system to facilitate the rapid transfer of heat from the photovoltaic panel to the liquid transfer system. In some instances, during periods when, due to surrounding ambient conditions, moisture will not naturally form, the water producing system described herein may employ a controlled water emitting means to ensure saturation of the moisture collection layer. Thus, the water producing system described herein may rapidly and efficiently take advantage of ambient environment and temperatures to facilitate and improve heat transfer from the photovoltaic panel, thereby improving efficiency of the photovoltaic panel, reducing degradation of the panel, and improving a lifespan of the panel. Additionally and/or alternatively the moisture collection layer may feed an agriculture or drip system that allows for irrigation of plants, such as in environments where a large amount of water for irrigating the plants is limited. The water collection substrate may include a coating or otherwise be made of a material that is suitable for collecting the generated water or condensation.

In some implementations, the water producing system consistent with implementations of the current subject matter may be installed onto existing solar farms or photovoltaic panels. For example, the system may enable the installation of liquid transfer systems and backing with one or multiple photovoltaic panels. In some implementations, the water producing system is used without one or more photovoltaic panels and instead, may be used for producing water.

Accordingly, the water producing system 100 described herein may result in photovoltaic output levels of 10% or greater, may remove or reduce heat stress on and/or failure of the photovoltaic panels, and/or the like, and may increase an amount of moisture or water collected from use of the water producing system 100.

FIG. 1 schematically illustrates a water producing system 100, consistent with implementations of the current subject matter. The water producing system 100 may include an energy dissipating receiver 20, a moisture collection layer (e.g., a layer including a foam, a metal, a metallic honeycomb, a metallic mesh, an aluminum mesh, mineral wool, and/or the like) 40, a liquid transfer system or mat 50, and a water collection substrate 60. The water collection substrate 60 may support the liquid transfer system 50, and may collect the water formed on a surface of the water collection substrate 60. In some implementations, the energy dissipating receiver 20 is optionally included in the water producing system 100.

In some implementations, the moisture collection layer 40 defines an open loop system. The open loop system may be positioned between the energy dissipating receiver 20 and the liquid transfer system 50. Thus, the open loop system may facilitate and/or improve a transfer of heat from the energy dissipating receiver 20 to the liquid transfer system 50. The open loop system may collect and/or retain moisture, such as water or another liquid, from the air and/or from a surface of the liquid transfer mat 50, and allows the moisture to escape, and/or be passively transferred out of the open loop system. For example, the open loop system may allow for the moisture to flow to an agricultural irrigation system, the environment, and/or the like. The moisture collection layer 40 may improve heat transfer from the energy dissipating receiver 20 to, for example, the liquid transfer system 50. Such configurations may desirably improve the efficiency and life expectancy of the energy dissipating receiver 20 and reduce degradation of the energy dissipating receiver 20.

Additionally and/or alternatively, the liquid transfer system 50 includes a heat transfer fluid, such as water, a refrigerant, antifreeze, and/or the like. The heat transfer fluid may flow through the liquid transfer system 50 to absorb heat from, for example, the energy dissipating receiver 20. Once the heat transfer fluid absorbs the heat, the heated heat transfer fluid may be directed to another system, such as a warmed fluid processing system including a pool, an air conditioning system, a space heating system, a hot water processing system, an agricultural system, a bathroom, a dishwasher, and/or the like, and/or be redirected through the liquid transfer system 50. The warmed fluid may be thus be pre-heated, allowing the warmed fluid to be used for agricultural purposes.

In some implementations, the water producing system 100 includes a fluid chiller or other chilled fluid supply 15. The fluid chiller 15 may be fluidly coupled to the liquid transfer system 50. For example, an output of the fluid chiller 15 may be coupled to an input of the liquid transfer system 50 and an output of the liquid transfer system 50 may be coupled to an input of the fluid chiller 15. The fluid chiller 15 may be coupled to the liquid transfer system 50 by piping 16. The fluid chiller 15 may provide a chilled fluid, such as the heat transfer fluid described herein, to the liquid transfer system 50. Thus, together, the fluid chiller 15 and the liquid transfer system 50 may define a close loop system. In other words, the heat transfer fluid may be chilled by the chiller 15, supplied to the liquid transfer system 50 where the heat from the energy dissipating receiver 20 is absorbed by the heat transfer fluid, and the heated transfer fluid may be transferred back to the fluid chiller 15 to be chilled and/or another warmed fluid processing system, as described herein.

Figure 5A:
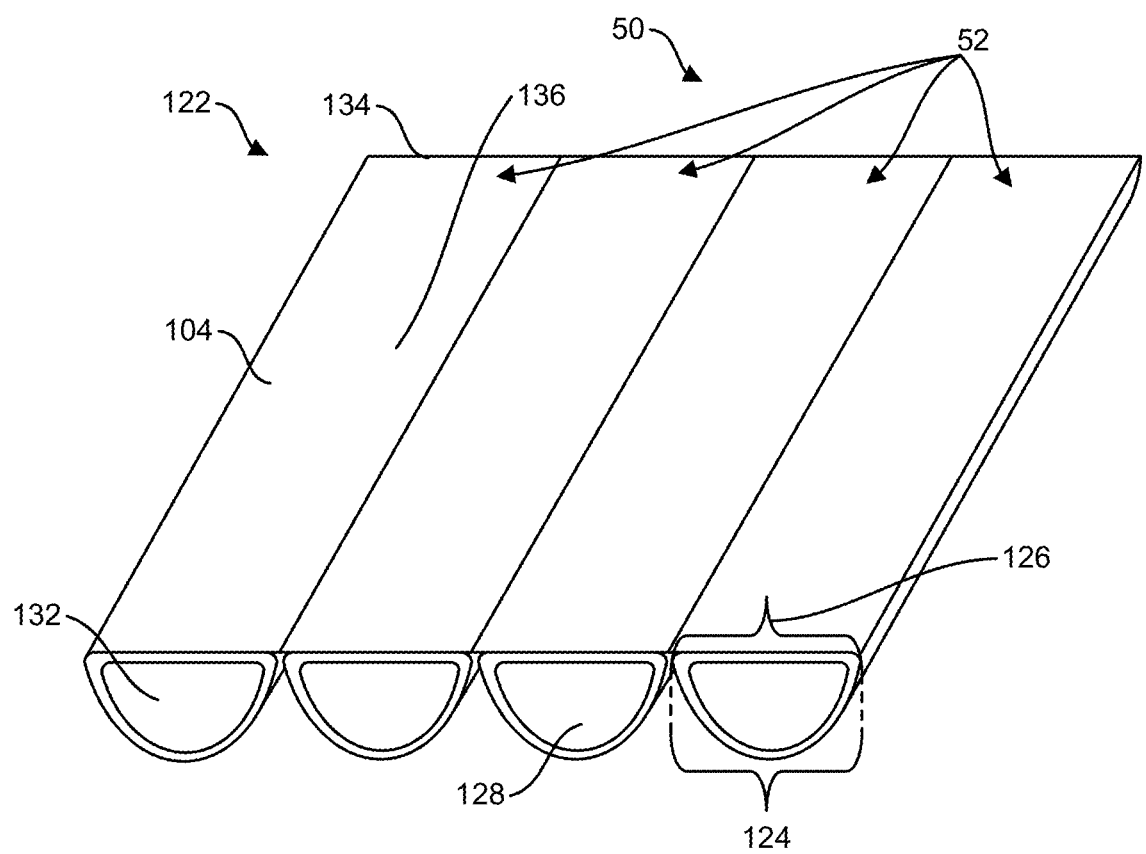
FIG. 5A illustrates an example liquid transfer mat consistent with implementations of the current subject matter.
Figure 5B:
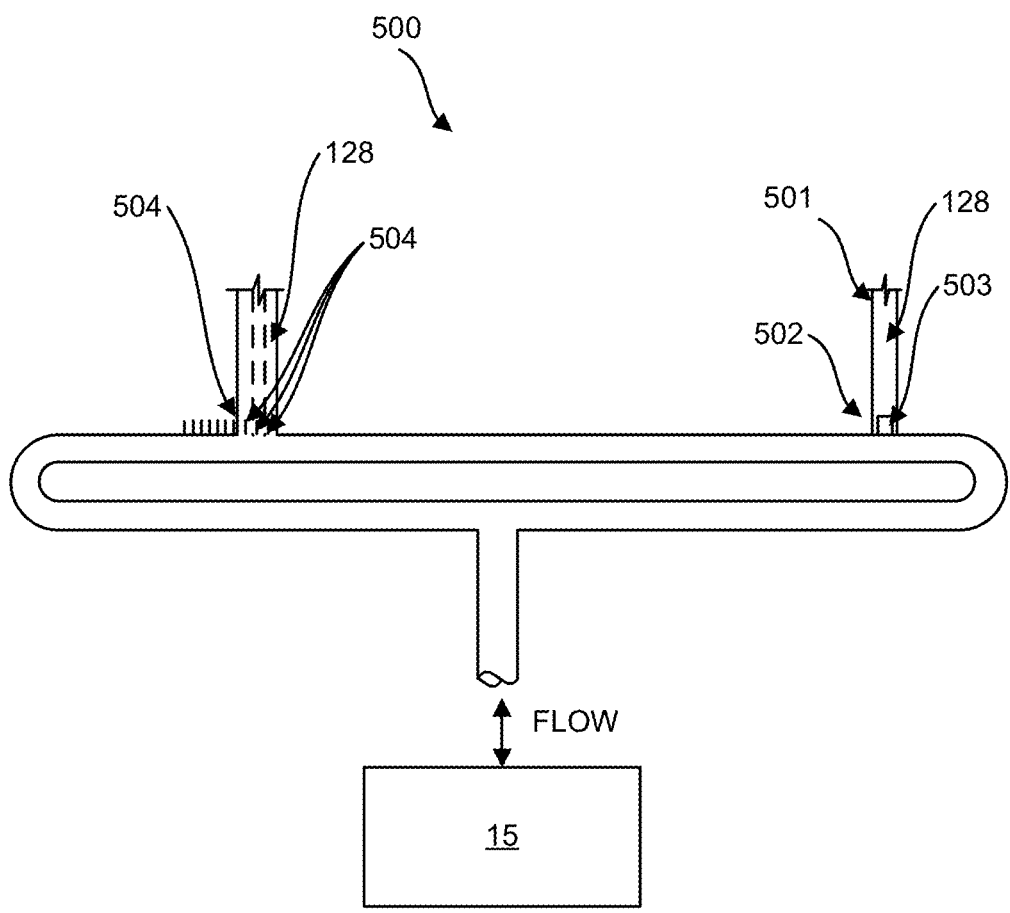
FIG. 5B illustrates an example balanced water feed and discharge piping arrangement for use with a liquid transfer mat consistent with implementations of the current subject matter.

In some implementations, the fluid chiller 15 may be coupled to the liquid transfer system via a balanced water feed and discharge piping arrangement. FIG. 5B illustrates an example of the balanced water feed and discharge piping arrangement 500, consistent with implementations of the current subject matter. The balanced water feed and discharge piping arrangement 500 may ensure even and/or consistent heat transfer between the liquid transfer system 50 and the moisture collection layer 40 and/or the heat dissipating receiver 22. The balanced water feed and discharge arrangement 500 may be coupled to the chiller 15 at one end and at the other end, may be coupled to at least one (e.g., one, two, three, four, five, or more) liquid transfer system 50 at the other end.

For example, referring to FIG. 5B, the balanced water feed and discharge piping arrangement 500 may be coupled to the chiller 15 at a center of the balanced water feed and discharge piping arrangement 500 at one end. The opposite end of the balanced water feed and discharge piping arrangement 500 may be coupled to two (or more) liquid transfer systems 50. For example, the liquid transfer systems 50 may be spaced apart across the opposite end of the balanced water feed and discharge piping arrangement 500. This configuration may ensure balanced flow of the fluid within the liquid transfer system 50 coupled to the balanced water feed and discharge piping arrangement 500. Such configurations may also protect the heat dissipating receiver 20 from becoming too hot or too cold.

The balanced water feed and discharge piping arrangement 500 may accommodate the same and/or different types of the liquid transfer systems 50. In some implementations, the opposite end of the balanced water feed and discharge piping arrangement 500 includes a nozzle corresponding to each channel 128 (described with respect to FIG. 5A) of the liquid transfer system 50. In some implementations, the balanced water feed and discharge piping arrangement 500 includes a plurality of nozzles that correspond to each channel 128 of the liquid transfer system 50. In some implementations, the balanced water feed and discharge piping arrangement 500 includes a first nozzle arrangement 502 including a single nozzle 503 configured to fit within and/or couple to a corresponding channel 128. The balanced water feed and discharge piping arrangement 500 may additionally and/or alternatively include a second nozzle arrangement 504 including a plurality of nozzles 505 configured to fit within and/or couple to a plurality of corresponding channels 128 of the liquid transfer system 50. For example, the second nozzle arrangement 504 may include two, three, or more nozzles for coupling to a plurality of corresponding channels 128. In some implementations, the plurality of nozzles of the second nozzle arrangement 504 have a same total width as the single nozzle of the first nozzle arrangement 502. Cooling, such as by the fluid chiller 15, the heat transfer fluid flowing through the liquid transfer system 50 may allow for a greater amount of water to condense or form on the water collection substrate 60 for collection. Cooling, such as by the fluid chiller 15, the heat transfer fluid flowing through the liquid transfer system 50 may allow for a greater amount of water to condense or form on the one or more surfaces of the liquid transfer mat 50 (e.g., a curved portion and/or a flat portion as described in more detail below). Consistent with implementations of the current subject matter, the moisture collection layer 40 described herein may absorb water from air in contact with the moisture collection layer 40 and/or water from condensation formed on one or more surfaces of the liquid transfer mat 50.

Referring again to FIG. 1, in some implementations, the fluid chiller 15 may include one or more (e.g., one, two, three, four, five, or more) chillers. For example, the fluid chiller 15 may include two or more chillers fluidly coupled in series. In such implementations, one or more of the fluid chillers may be used during the day and one or more fluid chillers may be used during the night. In some implementations, at least two fluid chillers are used during the night and/or during periods of lower temperatures to further increase the temperature differential between the chilled fluid and the ambient temperature, thereby producing a greater amount of condensation for collection.

Figure 2:
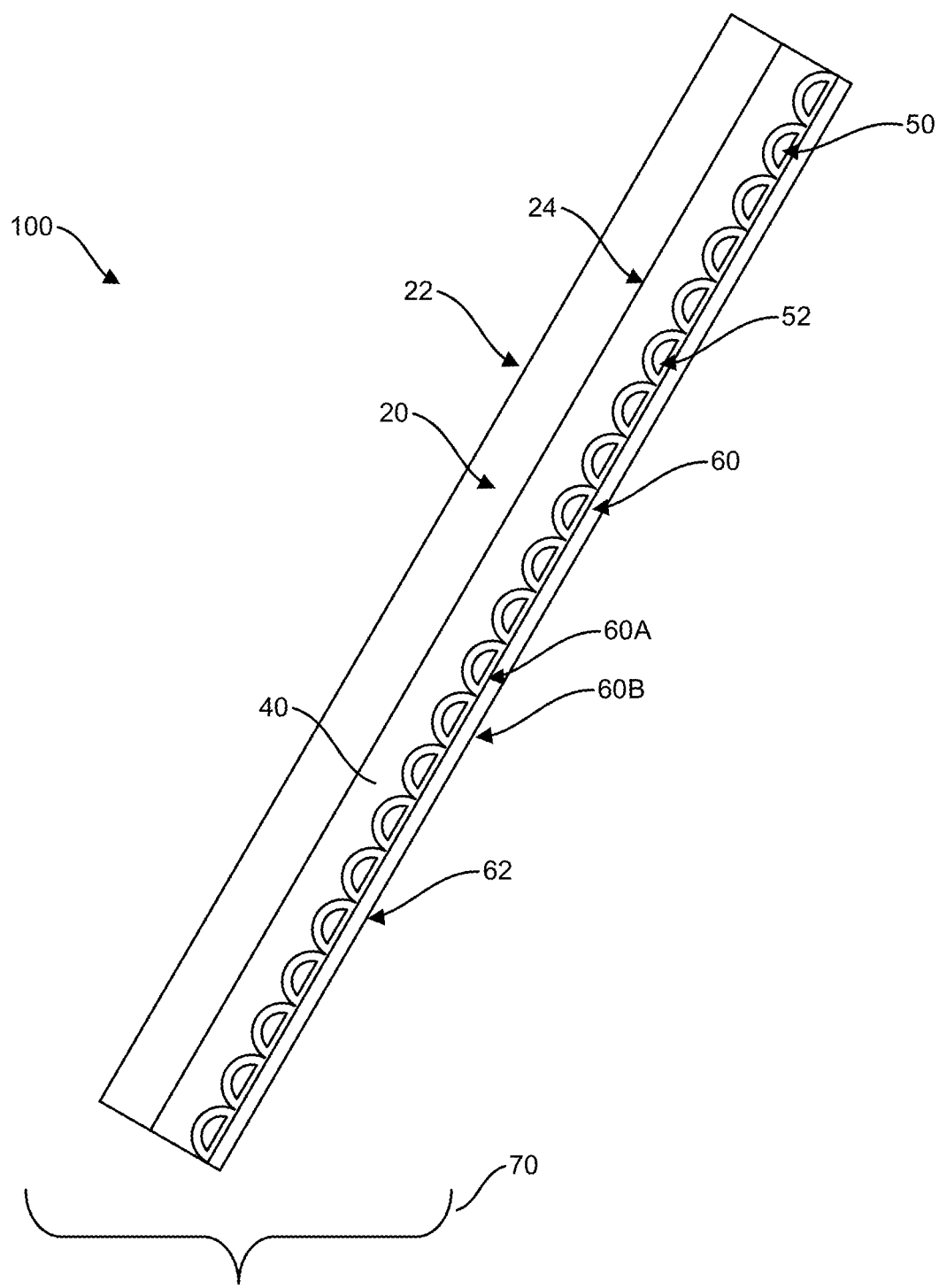
FIG. 2 illustrates a side cross-sectional view of a water producing system consistent with implementations of the current subject matter.

FIG. 2 schematically illustrates an example of the water producing system 100 consistent with implementations of the current subject matter. As shown in FIG. 2, the water producing system 100 may include or be coupled to the energy dissipating receiver 20. The energy dissipating receiver 20 may include a photovoltaic ("PV") panel, such as a solar panel and/or a photovoltaic-thermal panel. For example, the energy dissipating receiver 20 may generate thermal energy and/or electrical energy by converting absorbed solar energy into the thermal energy and/or the electrical energy. In some implementations, the generated thermal energy and/or electrical energy may be used to heat water, a refrigerant, and/or antifreeze, heat pool water, feed air conditioning systems, a lithium processing and/or extraction systems, battery management systems (e.g., stored in batteries), and/or the like.

In some implementations, the energy dissipating receiver 20 includes a first side 22 configured to absorb solar energy, and a second side 24 opposite the first side. The moisture collection layer 40 (e.g., the open loop system) may contact and/or be positioned adjacent to the second side (or back side) of the energy dissipating receiver 20. This allows for the moisture collection layer 40 to efficiently extract and/or otherwise facilitate transfer of the heat emitted from the energy dissipating receiver 20 (such as from the back or second side 24). For example, the moisture collection layer 40 may facilitate and/or improve heat transfer from the energy dissipating receiver 20 to the heat transfer fluid flowing within the liquid transfer system 50. This may additionally and/or alternatively reduce a temperature of the energy dissipating receiver 20 and/or to collect the heat emitted from the energy dissipating receiver 20.

Consistent with implementations of the current subject matter, while the energy dissipating receiver 20 may be described herein as including a single panel, the energy dissipating receiver 20 may include a plurality of panels (e.g., 2, 3, 4, 5, 10, 50, 100, 500, 1000, or more panels, and/or other ranges therebetween or greater). Each panel may be positioned over and/or coupled to separate water producing systems 100. Each panel may additionally and/or alternatively be positioned over and/or be coupled to a single moisture collection layer 40 and/or liquid transfer mat 50.

In some implementations, the electrical energy generated by the energy dissipating receiver 20 may be used to supply power to the fluid chiller 15, to, for example, cool the heat transfer fluid to be supplied to the liquid transfer mat 50.

In some implementations, the water producing system 100 may include an insulator layer coupled to the moisture collection layer 40 and positioned between the energy dissipating receiver 20 and the moisture collection layer 40. The insulator layer may include an electric insulation material. For example, the insulator layer may include a thermoplastic membrane, such as a nonpolar thermoplastic membrane. The insulator layer may additionally and/or alternatively include a fire and/or flame retardant material. The fire and/or flame retardant material may form a part of the insulator layer and/or may be coupled to the insulator layer, such as via a spray, a coating, and/or the like. For example, the fire and/or flame retardant material may be Class B rated by the fire code. The insulator layer may thus help to insulate the electrical components of the energy dissipating receiver 20 from the moisture and/or fluid of the foam 40, thereby preventing or limiting failure of the energy dissipating receiver 20. In some implementations, the insulator layer may include a material that has a high thermal conductivity. This allows for efficient and effective heat transfer through the insulator layer to the liquid transfer mat or system 50.

Referring to FIGS. 1 and 2, the moisture collection layer 40 may collect moisture from condensation on the liquid transfer mat 50 and/or direct moisture away from the energy dissipating receiver 20. For example, as described herein, at the point of saturation (e.g., when air cannot retain moisture known as dew point), water forms on cool surfaces, such as on one or more surfaces of the one or more surfaces of the liquid transfer mat 50, and/or one or more surfaces of the moisture collection layer 40. This process may generally occur at night, during the morning, and/or during cooler days. During the heat of the day, as ambient hot air pulls moisture from surrounding environments, moisture will also form on the cool surfaces. The moisture collection layer 40 may take advantage of these conditions. For example, the moisture collection layer 40 may absorb or otherwise collect the moisture formed on the liquid transfer mat 50, and/or the moisture collection layer 40. The collected moisture stored within the moisture collection layer 40 may help to improve thermal conductivity and heat transfer between the energy dissipating receiver 20 and the liquid transfer mat 50. For example, the collected moisture may facilitate rapid heat transfer from the energy dissipating receiver 20. This helps to quickly reduce a temperature of the energy dissipating receiver 20 to allow the energy dissipating receiver 20 to operate at a lower temperature, thereby extending the lifespan of the energy dissipating receiver 20, reducing or preventing degradation of the energy dissipating receiver 20, and/or improving the efficiency of the energy dissipating receiver 20.

In some implementations, the moisture collection layer 40 helps to prevent or limit thermal shock of the energy dissipating receiver 20 that would otherwise occur when a cold surface or liquid directly contacts the energy dissipating receiver 20. For example, the material of the moisture collection layer 40 may contain the absorbed moisture without allowing the moisture to get too cold. The moisture collection layer 40 may additionally and/or alternatively provide a barrier between the liquid transfer mat 50 and the energy dissipating receiver 20, to prevent or limit the impact of the initially cold fluid passing through the liquid transfer mat 50 on the energy dissipating receiver 20. This may be particularly desirable when the moisture collection layer 40 is used with the closed loop system described herein. For example, the surfaces of the liquid transfer mat 50 may be colder since the heat transfer fluid flowing through the liquid transfer mat 50 is chilled, such as by the fluid chiller 15. The moisture collection layer 40 may additionally and/or alternatively prevent the energy dissipating receiver 20 from cracking and/or freezing, such as during circumstances when there are large temperature changes.

Consistent with implementations of the current subject matter, the moisture collection layer 40 may form a part of an open loop system, as described above. As part of the open loop system, the moisture collected and/or absorbed by the moisture collection layer 40 may be delivered (e.g., passively, actively, and/or the like) to an agricultural system, such as an irrigation system, to the environment, and/or the like, and/or may be collected, such as in a water collection container 70 (see FIG. 2). Such configurations may be useful in environments, such as deserts, in which water for irrigation is not readily available.

The moisture collection layer 40 may include an absorbent material. For example, the moisture collection layer 40 may include a foam, such as an open cell dense foam, a porous material, a porous reticulated foam, and/or the like. The material of the moisture collection layer 40 may additionally and/or alternatively be fire retardant and/or have a high thermal conductivity. This allows for efficient and effective heat transfer from the energy dissipating receiver 20 to the heat transfer fluid in the liquid transfer mat 50, to, for example, rapidly reduce a temperature of the energy dissipating receiver 20 and/or rapidly heat the chilled heat transfer fluid flowing through the liquid transfer mat or system 50.

In some implementations, the moisture collection layer 40 has a thickness that allows for an optimal amount of moisture collection, while maintaining a high thermal conductivity to facilitate rapid heat transfer between the energy dissipating receiver 20 and the liquid transfer mat 50. For example, the moisture collection layer 40 may have a thickness of approximately 0.25 to 0.5 inches, 0.1 to 0.2 inches, 0.2 to 0.3 inches, 0.3 to 0.4 inches, 0.4 to 0.5 inches, 0.5 to 0.6 inches, 0.6 to 0.7 inches, 0.7 to 0.8 inches, 0.8 to 0.9 inches, 0.9 to 1.0 inches, and/or other ranges therebetween, greater, or lower.

In some implementations, the water producing system 100 includes a drip system that allows moisture to escape from the moisture collection layer 40 and/or may remove moisture stored within the moisture collection layer 40. For example, the drip system may include a drip line, such as a low volume water drip line or other irrigation system. The drip system may be passive, such that the moisture stored within the moisture collection layer 40 passively escapes and/or otherwise flows from the moisture collection layer 40. Additionally and/or alternatively, the drip system may be active, such that the moisture stored within the moisture collection layer 40 is actively (e.g., via a pump) transferred from the moisture collection layer 40. The drip system may provide for a microenvironment for herbs or high value small crops that can grow behind the energy dissipating receiver 20, such as in cool areas behind the energy dissipating receiver 20. This allows for irrigation to be used and/or for plants to be grown in environments that would otherwise not be hospitable to such growth. The drip system may additionally and/or alternatively transfer the collected water to the water collection container 70 for later use and/or to feed the liquid transfer system or mat 50.

In some implementations, the moisture collection layer 40 may be rolled over or otherwise coupled to at least one side of the energy dissipating receiver 20 and/or the liquid transfer mat 50. This allows for easy and fast installation of the moisture collection layer 40. Additionally and/or alternatively, the moisture collection layer 40 may be modular. The modular design may allow for easier and quicker installation, such as in large grid scale systems that include many photovoltaic panels. Additionally and/or alternatively, the moisture collection layer 40 may include an adhesive, such as a peel-and-stick adhesive that allows for one or more of the layers to be coupled to one another, the energy dissipating receiver 20, and/or the liquid transfer mat 50 quickly and easily.

Consistent with implementations of the current subject matter, the moisture collection layer 40 facilitates heat transfer from the energy dissipating receiver 20 (e.g., the PV panel) to the heat transfer fluid flowing within the liquid transfer system or mat 50. Referring to FIG. 5A, the liquid transfer mat 50 may include a plurality of tubes through which a heat transfer fluid (e.g., a liquid such as water, antifreeze, a refrigerant, and/or the like) passes. The heat transfer fluid may absorb the heat transferred, extracted, and/or removed from the energy dissipating receiver 20. The heat transfer fluid may be recycled within the liquid transfer mat 50, for example, as part of the closed loop system. For example, the heat transfer fluid may be supplied by the fluid chiller 15 to the energy dissipating receiver 20, where the heat transfer fluid absorbs the heat from the energy dissipating receiver, may eject the heat (e.g., as part of a downstream system, such as an air conditioning system, a space heating system, a pool, a heat processing system, a lithium processing or extraction system, and/or the like), and be recycled within the liquid transfer mat 50 or be returned to the fluid chiller 15 to be chilled. As an example, the heat from the heated heat transfer fluid may be used for heating during lithium brine processing to reach desired ambient temperatures of 122 to 140 degrees fahrenheit. The heat transfer fluid may be held within storage tanks coupled to the liquid transfer mat 50 and/or the fluid chiller 15, and/or may be returned to the liquid transfer mat 50.

The liquid transfer mat 50 may include at least one absorption tube absorption tube 52. The absorption tube 52 may form all or a part of the liquid transfer mat 50. The absorption tube 52 may encourage a transfer of heat to a heat transfer fluid flowing through the absorption tube 52. For example, the absorption tube 52 may encourage a transfer of heat from the energy dissipating receiver 20 to the fluid flowing through the absorption tube 52.

In some implementations, the absorption tube 52 may extend in a direction that is perpendicular relative to the energy dissipating receiver 20. For example, the energy dissipating receiver 20 may be oriented in a first direction, and the absorption tube 52 (as part of the liquid transfer mat 50) may be oriented in a second direction that is perpendicular to the first direction. In some implementations, the absorption tube 52 may extend in a direction that is approximately 90 degrees, 180 degrees, 270 degrees and/or parallel to the direction of the energy dissipating receiver 20.

Referring to FIG. 5A, the absorption tube 52 may be an elongated tube. For example, the absorption tube 52 may be between 1 to 2 feet long, 2 to 5 feet long, 5 to 10 feet long, 10 to 25 feet long, 25 to 50 feet long, 50 to 100 feet long, 100 to 120 feet long, 120 to 150 feet long, 150 to 200 feet long, and/or other ranges therebetween.

In some implementations, the absorption tube 52 includes an array 122 of absorption tubes 52. The array 122 may include a plurality of absorption tubes 52. The plurality of tubes may be coupled together and/or integrally formed to define the liquid transfer mat 50. The mat may be un-rolled and/or otherwise positioned to install the mat.

For example, the array 122 may include one, two, three, four, five, six, seven, eight, nine, ten, or more absorption tubes 52. As part of the array 122, each of the plurality of absorption tubes 52 may be positioned adjacent to one another. For example, the absorption tubes 52 may include a first end 132, a second end 134, and a tube 136 that extends between the first end 132 and the second end 134. The tube 136 may extend lengthwise between the first end 132 and the second end 134. Each of the tubes 136 may be positioned adjacent to one another and/or may be coupled to one another along the length of the tubes 136. In some implementations, each of the plurality of absorption tubes 52 may be separated by a perforation that allows for tearing of each absorption tube 52 from the array 122.

FIG. 5A illustrates an example of the array 122 of absorption tubes 52, consistent with implementations of the current subject matter. Each absorption tube 52 may include a curved portion 124 and a flat portion 126. The absorption tube 52 may also include a channel 128 extending through a length (e.g., the entire length) of the interior of the absorption tube 52. The channel 128 allows the heat transfer fluid, such as water, antifreeze, refrigerant, and/or the like, to flow through the absorption tube 52 and absorb the transferred heat from the sun and/or from the energy dissipating receiver 20. The channel 128 may be coupled to one or more pipes 16 that are coupled to the fluid chiller or chilled water supply 15. Additionally and/or alternatively, each absorption tube 52 may be entirely curved or cylindrical, may be separated by webbing, and/or the like.

Referring again to FIG. 5A, the absorption tube 52 includes the curved outer surface or curved portion 124 and the flat outer surface or flat portion 126. The curved portion 124 may have a half-oval, semi-circle, arched and/or otherwise curved shape. The curved portion 124 may have a radius of approximately 0.375 in., 0.1 to 0.2 in., 0.2 to 0.3 in., 0.3 to 0.4 in., 0.4 to 0.5 in., 0.5 to 0.6 in., and/or other ranges therebetween. In some implementations, the flat portion has a length of approximately 1.5 in., 0.5 to 0.75 in., 0.75 to 1.0 in., 1.0 to 1.5 in., 1.5 to 2.0 in., 2.0 to 2.5 in., and/or other ranges therebetween. In some implementations, the curved portion 124 has a length of approximately 1.18 in., 0.8 to 0.9 in., 0.9 to 1.0 in., 1.0 to 1.1 in., 1.1 to 1.2 in., 1.2 to 1.3 in., 1.3 to 1.4 in., and/or the like. The curved portion 124 and the flat portion 126 may be integrally formed. For example, the curved portion 124 and the flat portion 126 may together form a perimeter of the absorption tube 52. Such configuration helps to maintain the structural integrity of the absorption tube 52 and helps to limit or prevent deformation or collapse of the absorption tube 52. Such configurations may also eliminate the need for internal webbing to prevent collapse or deformation of the absorption tube 52.

In some implementations, the curved portion forms greater than or equal to 50% of the perimeter of the absorption tube 52 and the flat portion forms less than or equal to 50% of the perimeter. In some implementations, the curved portion forms greater than or equal to 25% of the perimeter of the absorption tube 52 and the flat portion forms less than or equal to 75% of the perimeter, the curved portion forms greater than or equal to 33.33% of the perimeter of the absorption tube 52 and the flat portion forms less than or equal to 66.66% of the perimeter, the curved portion forms greater than or equal to 45% of the perimeter of the absorption tube 52 and the flat portion forms less than or equal to 55% of the perimeter, the curved portion forms greater than or equal to 55% of the perimeter of the absorption tube 52 and the flat portion forms less than or equal to 45% of the perimeter, the curved portion forms greater than or equal to 66.66% of the perimeter of the absorption tube 52 and the flat portion forms less than or equal to 33.33% of the perimeter, the curved portion forms greater than or equal to 75% of the perimeter of the absorption tube 52 and the flat portion forms less than or equal to 25% of the perimeter, and/or the like.

In some implementations, the absorption tube 52 includes an absorbing or first side and a second side opposite the first side. The first side may be configured to absorb or remove heat and transfer the heat to the heat transfer fluid flowing within the channel 128. In some implementations, the first or absorbing side faces in a direction towards the energy dissipating receiver 20. The first or absorbing side may face in a direction towards and/or may contact the moisture collection layer 40. The perimeter of each tube (e.g., a total length of the curved portion and the flat portion, such as a perimeter of a cross-section of each tube, a perimeter of a side at the first end and/or the second end of each tube, and/or the like) may be approximately 2.68 in., 1.5 to 1.75 in., 1.75 to 2.0 in., 2.0 to 2.25 in., 2.25 to 2.5 in., 2.5 to 2.75 in., 2.75 to 3.0 in., and/or the like. In some implementations, a thickness of the wall of the absorption tube, such as between the exterior surface of the channel and the exterior surface of the absorption tube, is approximately 0.1 to 0.25 in., 0.25 to 0.5 in., 0.5 to 0.75 in., and/or the like. As an example, a total width of the array 122, shown in FIG. 5A, including at least four absorption tubes (e.g., a first, second, third, and/or fourth absorption tube) may be approximately 6 inches, although, as described herein other widths are contemplated and may be tuned depending on the available space.

In some implementations, the flat portion 126 defines the absorbing side or the first side. This allows the flat portion 126 to have maximum contact (or surface area in contact) with the moisture collection layer 40, or other flat surface to absorb or release heat to the heat transfer fluid flowing through the channel 128. Such configurations also provide a maximum heat transfer surface to face towards the energy dissipating receiver 20 and/or contact the moisture collection layer 40, to allow for maximal and/or efficient transfer of heat to the absorption tube 52. Such configurations may additionally and/or alternatively allow for a greater amount of condensation formed on the flat portion 126 to be absorbed by the moisture collection layer 40, such as when the chilled fluid flows through the liquid transfer mat 50. In other implementations, the curved portion 124 defines the absorbing side or first side. This allows the curved portion 124 to be directly exposed to moisture collection layer 40 to provide a greater surface area for absorbing heat, allowing the flat portion 126 to be adhered or otherwise coupled to a surface, structure, roof or other structure. Such configurations may additionally and/or alternatively allow for a greater amount of condensation formed on the curved portion 124 to be absorbed by the moisture collection layer 40, such as when the chilled fluid flows through the liquid transfer mat 50. Additionally and/or alternatively both sides (e.g., the first and second sides) of the absorption tube 52 are flat and/or curved.

In some implementations, the array 122 of the absorption tubes 52 may be curved along a length of the array. In other words, at least one absorption tube 52 of the array 122 may be pre-formed in a curve or pre-curved between the first end 132 and the second end 134. The curve may include an interior and an exterior. The exterior of the curved absorption tube 52 may contact the moisture collection layer 40 to secure the absorption tube 52 against the moisture collection layer 40. For example, the curve may bias the absorption tube 52 against the moisture collection layer 40. This helps to maintain contact between the absorption tube 52 (or array 122) and the moisture collection layer 40, thereby more efficiently transferring heat from and/or cooling the energy dissipating receiver 20 through the moisture collection layer 40, and/or absorbing a greater amount of condensation from the surfaces of the liquid transfer mat 50.

The absorption tube 52, including the array 122, may include one or more materials suitable for absorbing heat and/or encouraging heat transfer. For example, the absorption tube 52, including the array 122 may include one or more of a flexible ethylene propylene diene terpolymer ("EPDM"), a rubber, a plastic, a silicon rubber, a thermoplastic with high conductivity, an elastomer compound with a durometer suitable for rounding out, stretching, and/or the like. The material of the absorption tube 52 efficiently transfers heat to the fluid passing through the absorption tube 52.

Referring again to FIGS. 1-2, the water producing system 100 may include a water collection substrate 60. The water collection substrate 60 may be rigid or flexible. The water collection substrate 60 may support one or more layers of the water producing system 100, such as the energy dissipating receiver 20, the moisture collection layer 40, the liquid transfer mat 50, and/or the like. The water collection substrate 60 may be clipped onto or otherwise coupled to the energy dissipating receiver 20.

The water collection substrate 60 may include a material having a high thermal conductivity. For example, the material of the water collection substrate may include high density polyethylene (HDPE), sheet metal, or other material, such as materials having a high thermal conductivity. The high thermal conductivity of the material of the water collection substrate 60 allows for a greater amount of water to be produced, collected, and/or condensed on an exposed surface of the water collection substrate 60.

For example, the water collection substrate 60 may include a first side 60A and a second side 60B. The first side 60A may face towards and/or contact the liquid transfer mat 50. The second side 60B may be opposite the first side 60A and face away from the liquid transfer mat 50. In other words, the second side 60B may be exposed to the ambient air and atmospheric conditions. The material (e.g., the high thermal conductivity material) of the water collection substrate 60 (alone or in combination with the chilled heat transfer fluid) allows, heat from the warm, humid air contacting the water collection substrate 60, such as at the second side 60B, to quickly and efficiently transfer to the chilled heat transfer fluid within the liquid transfer mat 50. Due to the temperature difference in the ambient air temperature and the chilled heat transfer fluid, and/or the high thermally conductive material of the water collection substrate 60, a significant amount of water (e.g., moisture, condensation, etc.) may form on the exposed surface (e.g., the second side 60B) of the water collection substrate 60. Additionally and/or alternatively, the low temperature of the chilled fluid flowing through the liquid transfer mat 50 creates a low dew point at the water collection substrate 60, such as at the second side 60B. The low dew point and/or the high thermal conductivity of the water collection substrate 60 beneficially draws moisture out of the ambient air, such as air having a relative humidity of 30% to 40%, 10% to 20%, 20% to 30%, 40% to 50%, 50% to 60%, or higher, or other ranges therebetween. Thus, the water producing system 100 consistent with implementations of the current subject matter may produce thousands of gallons of water per day. Such water production can be helpful in climates where minimal water is available, for agricultural processes, for mining processes, and/or other processes, as described herein.

Referring again to FIG. 2, the water collection substrate 60 may include a coating 62. The coating 62 may include a surfactant, a hydrophobic material (e.g., a hydrophobic nanotechnology material), and/or the like. The coating 62 may allow for water to collect on the exposed surface, such as the second side 60B of the water collection substrate 60, without being absorbed by the water collection substrate 60. Thus, the coating 62 may help to allow the water collected on the water collection substrate 60 to be easily directed to the water collection container 70, connected piping, or other water collection or transfer mechanisms.

As shown in FIG. 2, the water producing system 100 may be angled or sloped. Such configuration may allow for the water produced and/or collected to be easily transferred to the water collection container 70, connected piping, or other water collection or transfer mechanisms. Additionally, the water collection container 70 may collect rain water from ambient conditions and/or from one or more surfaces of the water producing system 100. Thus, the water collection container 70 may collect water from the moisture collection layer 40, the liquid transfer mat 50, the moisture collection substrate 60, rain water, and/or the like. In some implementations, the water producing system 100 includes one or more evaporation prevention or limiting mechanisms to prevent and/or limit evaporation of the water collected within the water collection container 70 and/or on one or more surfaces of the water producing system 100.

In some implementations, the water producing system 100 may not include and/or may not be used with the energy dissipating receiver 20. Rather than both reducing a temperature of the energy dissipating receiver to reduce degradation of the energy dissipating receiver 20 and produce water, the water producing system 100 may produce and/or collect water. For example, FIGS. 3 and 4 illustrate examples of the water producing system 100, consistent with implementations of the current subject matter, in which the liquid transfer mat 50 and/or the water collection substrate 60 are used for producing and/or collecting water.

Figure 3:
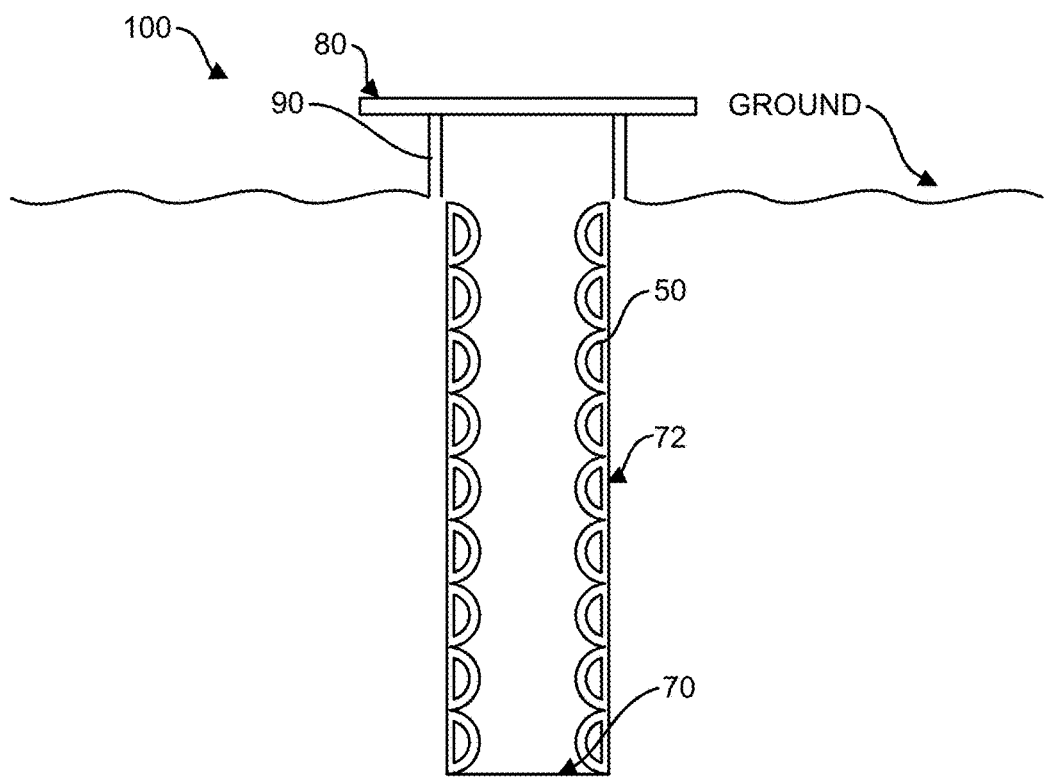
FIG. 3 illustrates a portion of a side cross-sectional view of a water producing system consistent with implementations of the current subject matter.
Figure 4:
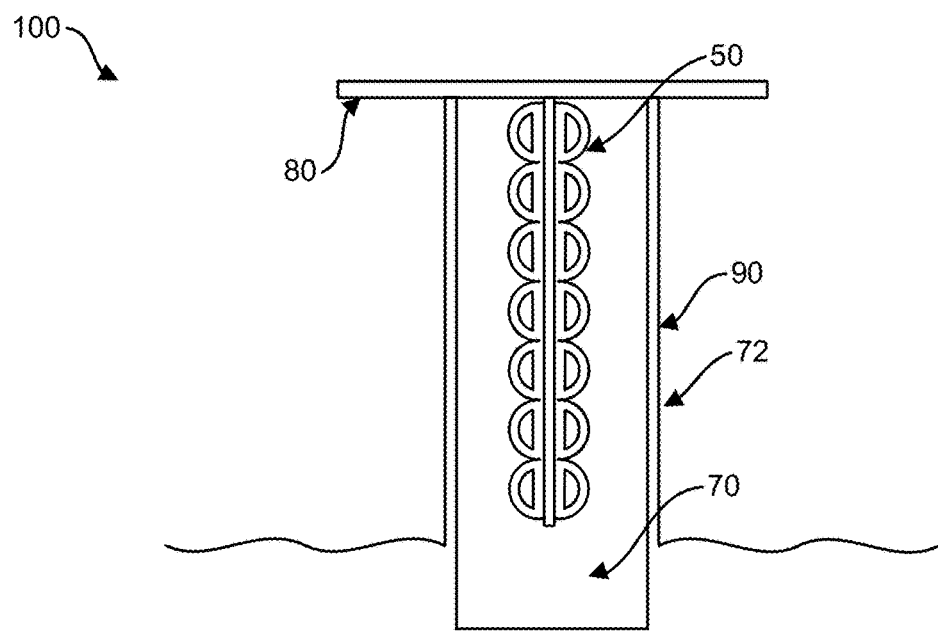
FIG. 4 illustrates a portion of a side cross-sectional view of a water producing system consistent with implementations of the current subject matter.

As an example, FIG. 3 illustrates a water producing system 100 for producing and/or collecting water below ground level. As shown in FIG. 3, the water producing system 100 may include an enclosure 72. In this example, the enclosure 72 is positioned underground. The liquid transfer mat 50 and/or the water collection substrate 60 (not shown) may be positioned along one or more interior walls of the enclosure 72 and/or within the interior of the enclosure 72.

The water producing system 100 may additionally and/or alternatively include a solar shield 80 and/or a screen 90. The solar shield 80 may cover an opening of the enclosure 72. The solar shield 80 may absorb solar energy. For example, the solar shield 80 may absorb solar energy to heat the interior of the enclosure 72. Heating the interior of the enclosure 72 may raise the air temperature within the enclosure. As described herein, when the warmer air contacts the liquid transfer mat 50 and/or the moisture collection substrate 60, water condenses on the surface of the liquid transfer mat 50 and/or the moisture collection substrate 60, due at least in part to the temperature difference between the chilled heat transfer fluid and the air. Warming the air within the enclosure 72 creates a greater temperature differential, leading to a greater amount of water being generated and collected. The water produced within the enclosure 72 may be collected in the water collection container 70 and/or may be transferred to another system, as described herein.

Referring to FIG. 3, the screen 90 may couple the solar shield 80 to the enclosure 72 and/or may support the solar shield 80 over the enclosure 72. The screen 72 may help to limit or prevent dust from entering the enclosure 72. This may be useful in certain environments, such as deserts, where there is a significant amount of dust. Thus, the screen 72 may help to keep dust or other debris away from the produced and/or collected water.

As another example, the water producing system 100 shown in FIG. 4 may have the same or similar components and/or properties of the water producing system 100 shown in FIG. 3. As shown in FIG. 4, the water producing system 100 may produce and/or collect water above ground level. As shown in FIG. 4, the enclosure 72 is positioned above ground and may be define a volume surrounded by the screen 90 and/or the solar shield 80. The liquid transfer mat 50 and/or the water collection substrate 60 (not shown) may be positioned along one or more interior walls of the enclosure 72 and/or within the interior of the enclosure 72.

Figure 6:
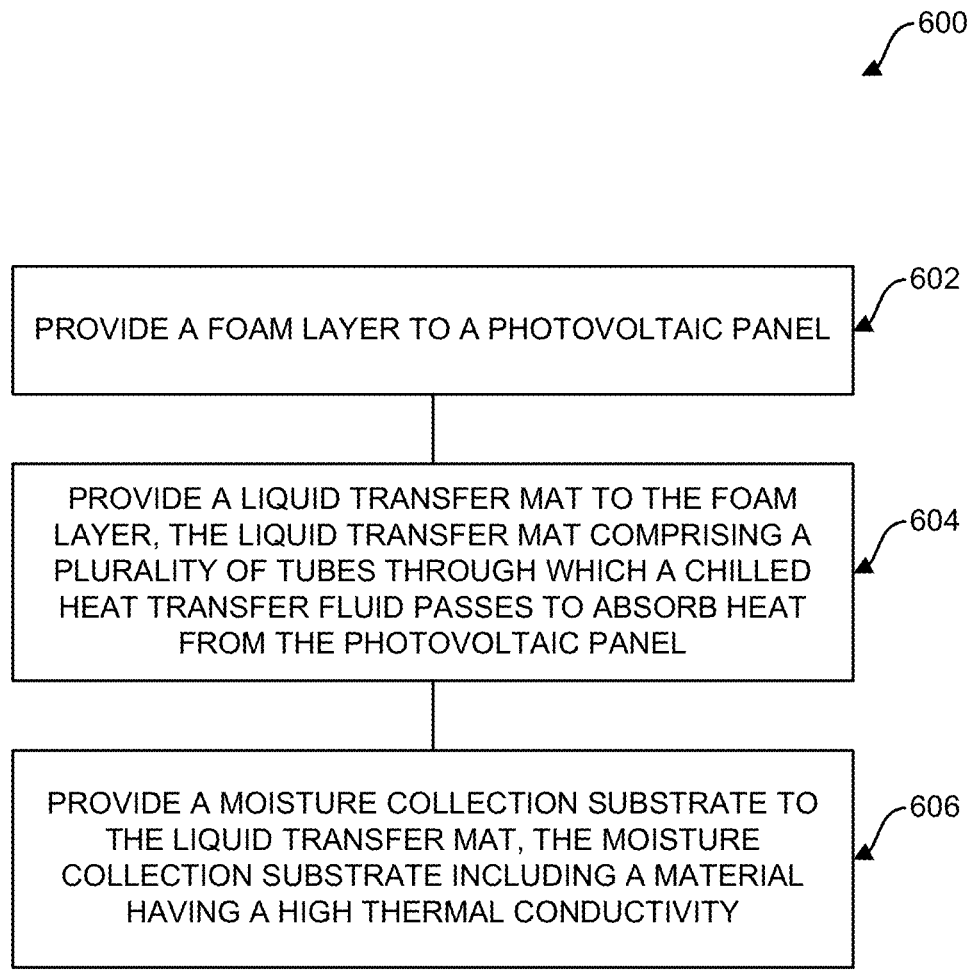
FIG. 6 is an example method of producing water and recovering heat consistent with implementations of the current subject matter.

FIG. 6 illustrates an example method 600 of recovering heat from a photovoltaic panel, consistent with implementations of the current subject matter.

At 602, a moisture collection layer, such as the moisture collection layer 40, is provided to a photovoltaic panel, such as the energy dissipating receiver 20. As described herein, the moisture collection layer 40 may include an open cell material configured to absorb moisture, such as moisture forming on one or more surfaces of the water producing system 100 (e.g., the liquid transfer mat 50). The moisture collection layer may supply the collected water to a container or other system. In some implementations, the moisture collection layer is configured to recover the heat from the photovoltaic panel, thereby reducing a temperature of the photovoltaic panel, reducing degradation of the panel, and/or improving heat transfer from the panel.

At 604, a liquid transfer mat, such as the liquid transfer mat 50, may be provided to the moisture collection layer. Providing the liquid transfer mat may include coupling the mat to the moisture collection layer. The liquid transfer mat may, as described herein, include a plurality of tubes through which a chilled fluid passes to absorb heat from the photovoltaic panel. The chilled fluid may be supplied to the liquid transfer mat from a fluid chiller plant or other chilled fluid supply. The moisture collection layer may thus encourage rapid heat transfer from the photovoltaic panel to the liquid transfer mat. Passing the chilled fluid through the liquid transfer mat may cause condensation to form on one or more surfaces of the liquid transfer mat and/or a moisture collection substrate coupled to the liquid transfer mat, as described herein.

At 606, a moisture collection substrate, such as the moisture collection substrate 60, may be provided to the liquid transfer mat. The moisture collection substrate may be coupled to the liquid transfer mat, such as via a mechanical coupling, adhesive, and/or the like. The moisture collection substrate may include a material having a high thermal conductivity. This allows for the warm ambient air to transfer to the chilled heat transfer fluid more quickly thereby producing a greater amount of water that condenses on a surface of the moisture collection substrate. The produced water may be collected (alone or in combination with the moisture collected from the moisture collection layer), transferred to a fluid chiller and/or transferred to another processing system.

Figure 7:
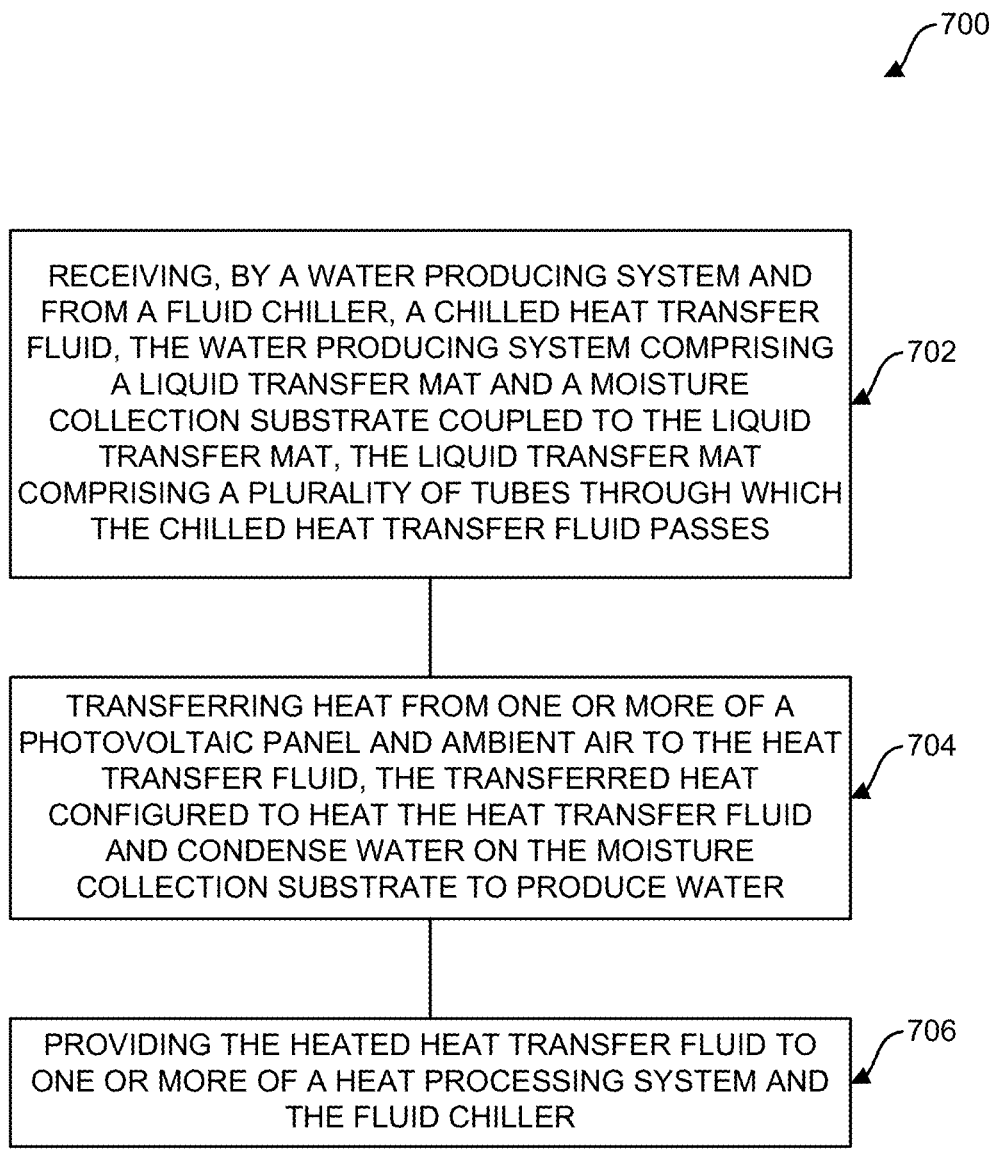
FIG. 7 is an example method of producing water and recovering heat consistent with implementations of the current subject matter.

FIG. 7 illustrates an example method 700 of producing water, consistent with implementations of the current subject matter.

At 702, a water producing system, such as the water producing system 100, may receive, such as from a fluid chiller (e.g., the fluid chiller 15) or another chilled water supply, chilled heat transfer fluid. The water producing system, as described herein, may include a liquid transfer mat (e.g., the liquid transfer mat 50) and a moisture collection substrate (e.g., the moisture collection substrate 60) coupled to the liquid transfer mat. The liquid transfer mat may include a plurality of tubes through which the chilled heat transfer fluid passes.

At 704, heat may be transferred from one or more of a photovoltaic panel and ambient air to the heat transfer fluid within the liquid transfer mat. The transferring of the heat to the heat transfer fluid may cause the heat transfer fluid to become heated and/or water to be condensed on the moisture collection substrate, thereby producing water. The produced water may be used for various processes, as described herein.

At 706, the heated heat transfer fluid may be returned to the fluid chiller to be chilled, and/or may be provided to one or more heat processing systems, as described herein.

Although the disclosure, including the figures, described herein may described and/or exemplify these different variations separately, it should be understood that all or some, or components of them, may be combined.

Although various illustrative embodiments are described above, any of a number of changes may be made to various embodiments. For example, the order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the claims.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. References to a structure or feature that is disposed "adjacent" another feature may have portions that overlap or underlie the adjacent feature.

Terminology used herein is for the purpose of describing particular embodiments only and is not intended to be limiting. For example, as used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as, for example, "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings provided herein.

Throughout this specification and the claims which follow, unless the context requires otherwise, the word "comprise", and variations such as "comprises" and "comprising" means various components can be co-jointly employed in the methods and articles (e.g., compositions and apparatuses including device and methods). For example, the term "comprising" will be understood to imply the inclusion of any stated elements or steps but not the exclusion of any other elements or steps.

As used herein in the specification and claims, including as used in the examples and unless otherwise expressly specified, all numbers may be read as if prefaced by the word "about" or "approximately," even if the term does not expressly appear. The phrase "about" "or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical values given herein should also be understood to include about or approximately that value, unless the context indicates otherwise.

The examples and illustrations included herein show, by way of illustration and not of limitation, specific embodiments in which the subject matter may be practiced. As mentioned, other embodiments may be utilized and derived there from, such that structural and logical substitutions and changes may be made without departing from the scope of this disclosure. Although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, are possible.

In the descriptions above and in the claims, phrases such as, for example, "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The implementations set forth in the foregoing description do not represent all implementations consistent with the subject matter described herein. Instead, they are merely some examples consistent with aspects related to the described subject matter. Although a few variations have been described in detail herein, other modifications or additions are possible. In particular, further features and/or variations can be provided in addition to those set forth herein. For example, the implementations described above can be directed to various combinations and sub-combinations of the disclosed features and/or combinations and sub-combinations of one or more features further to those disclosed herein. In addition, the logic flows depicted in the accompanying figures and/or described herein do not necessarily require the particular order shown, or sequential order, to achieve desirable results. The scope of the following claims may include other implementations or embodiments.

What is claimed is:

1. A water producing system for a photovoltaic panel, the system comprising:
   a moisture collection layer configured to collect moisture from condensation and/or air in contact with the moisture collection layer, the moisture collection layer comprising a first side that is in contiguous contact with a side of the photovoltaic panel, the moisture collection layer further configured to direct moisture away from the photovoltaic panel, and the moisture collection layer further comprising a plurality of surfaces configured to collect and generate moisture and composed of at least one of a foam, a metallic honeycomb, a metallic mesh, an aluminum mesh, and a mineral wool;
   a liquid transfer mat comprising a plurality of tubes through which a chilled heat transfer liquid passes, wherein a first side of the liquid transfer mat contiguously contacts a second side of the moisture collection layer; and
   a water collection substrate configured to provide a second surface for water collection, the water collection substrate comprising a thermally conductive material configured to contact a second side of the liquid transfer mat;
   wherein the chilled heat transfer liquid within the liquid transfer mat is configured to absorb heat from the photovoltaic panel through the moisture collection substrate, thereby reducing a temperature of the photovoltaic panel and condensing water on the moisture collection layer and/or the water collection substrate to produce water, and
   wherein the moisture collection layer is positioned between the photovoltaic panel and the liquid transfer mat.

2. The system of claim 1, further comprising a fluid chiller configured to supply the chilled heat transfer liquid to the liquid transfer mat.

3. The system of claim 1, further comprising the photovoltaic panel.

4. The system of claim 3, wherein the photovoltaic panel comprises a first side configured to absorb solar energy; and a second side opposite the first side; wherein the moisture collection layer is configured to contact the second side of the photovoltaic panel.

5. The system of claim 3, wherein the moisture collection substrate further comprises a coating, the coating comprising one or more of a surfactant and a hydrophobic material, the coating configured to encourage the collection of water condensed on the moisture collection substrate.

6. The system of claim 1, wherein the moisture collection layer comprises one or more of an open cell dense foam, and a porous reticulated foam.

7. The system of claim 1, wherein moisture absorbed by the moisture collection layer and/or water condensed on the moisture collection substrate is collected in a water collection container.

8. The system of claim 1, wherein the liquid transfer mat comprises a flexible material.

9. The system of claim 1, wherein the water collection substrate is configured to support the liquid transfer mat.

10. The system of claim 2, wherein the fluid chiller and the liquid transfer mat define a closed loop system.

11. The system of claim 1, further comprising: an insulator layer coupled to the moisture collection layer and positioned between the photovoltaic panel and the moisture collection layer.

12. The system of claim 11, wherein the insulator layer comprises at least one of an electric insulation material.

13. The system of claim 1, wherein the liquid transfer mat further comprises a plurality of tubes each comprising an at least partially rounded surface that is oriented towards the moisture collection layer to provide an increased surface area for moisture condensation.

14. The system of claim 13, wherein the liquid transfer mat comprises a plurality of tubes each comprising a substantially rounded surface that is oriented towards the moisture collection layer to provide an increased surface area for moisture condensation.

15. The system of claim 1, wherein the liquid transfer mat further comprises a plurality of tubes positioned adjacent to each other and flexibly coupled to one another.

16. The system of claim 15, wherein the plurality of tubes contact at least one other tube along a parallel length.

17. The system of claim 1, wherein the liquid transfer mat further comprises a plurality of tubes that are coupled together and integrally formed.

18. The system of claim 12, wherein the insulator layer further comprises a flame retardant material.

19. The system of claim 1, wherein the moisture collection layer comprises a metallic mesh.

20. The system of claim 1, wherein the moisture collection layer is configured relative to the photovoltaic panel and the liquid transfer mat to ensure even and/or consistent heat transfer from the photovoltaic panel to the liquid transfer mat.

* * * * *